US009563086B2

(12) United States Patent
Lee et al.

(10) Patent No.: US 9,563,086 B2
(45) Date of Patent: Feb. 7, 2017

(54) LIQUID CRYSTAL DISPLAY DEVICE

(71) Applicant: Samsung Display Co., Ltd., Yongin-Si, Gyeonggi-Do (KR)

(72) Inventors: Cheol-Gon Lee, Seoul (KR); Jang Mi Kang, Bucheon-si (KR); Mee Hye Jung, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 15/014,867

(22) Filed: Feb. 3, 2016

(65) Prior Publication Data
US 2016/0320675 A1 Nov. 3, 2016

(30) Foreign Application Priority Data

Apr. 29, 2015 (KR) ........................ 10-2015-0060543

(51) Int. Cl.
| | |
|---|---|
| *H01L 27/14* | (2006.01) |
| *G02F 1/1343* | (2006.01) |
| *H01L 27/12* | (2006.01) |
| *G02F 1/1368* | (2006.01) |
| *G02F 1/1362* | (2006.01) |

(52) U.S. Cl.
CPC ....... *G02F 1/134309* (2013.01); *G02F 1/1368* (2013.01); *G02F 1/136286* (2013.01); *H01L 27/124* (2013.01); *G02F 2001/134345* (2013.01)

(58) Field of Classification Search
None
See application file for complete search history.

(56) References Cited

U.S. PATENT DOCUMENTS

| | | | |
|---|---|---|---|
| 2007/0235735 A1* | 10/2007 | Kim | ................ G02F 1/13624 257/59 |
| 2008/0036931 A1* | 2/2008 | Chan | ................ G02F 1/133707 349/38 |
| 2010/0079690 A1* | 4/2010 | Lee | ................ G02F 1/133707 349/37 |
| 2015/0035741 A1 | 2/2015 | Lee et al. | |

FOREIGN PATENT DOCUMENTS

| | | |
|---|---|---|
| KR | 10-2008-0040419 A | 5/2008 |
| KR | 10-2009-0122079 A | 11/2009 |
| KR | 10-2012-0070986 A | 7/2012 |
| KR | 10-2014-0025171 A | 3/2014 |
| KR | 10-2014-0048731 A | 4/2014 |

\* cited by examiner

*Primary Examiner* — Benjamin Sandvik
*Assistant Examiner* — Herve Assouman
(74) *Attorney, Agent, or Firm* — Innovation Counsel LLP

(57) ABSTRACT

A display device may include the following elements: a transistor; a first pixel electrode electrically connected to a drain electrode of the transistor and including a first-type subpixel electrode and a second-type subpixel electrode; a first-type common electrode overlapping the first-type subpixel electrode; a second-type common electrode overlapping the second-type subpixel electrode; a first-type common voltage line electrically connected to the first-type common electrode, electrically insulated from the second-type common electrode, and overlapping each of the first-type common electrode and the second-type common electrode; and a second-type common voltage line electrically insulated from the first-type common electrode, electrically connected to the second-type common electrode, and overlapping each of the first-type common electrode and the second-type common electrode.

20 Claims, 7 Drawing Sheets

LIQUID CRYSTAL DISPLAY DEVICE

CROSS-REFERENCE TO RELATED APPLICATION

This application claims priority to and the benefit of Korean Patent Application No. 10-2015-0060543 filed in the Korean Intellectual Property Office on Apr. 29, 2015; the entire contents of the Korean Patent Application are incorporated herein by reference.

BACKGROUND (a) Technical Field

The technical field relates to a liquid crystal display.

(b) Description of the Related Art

A liquid crystal display (LCD) device may include a pixel electrode, a common electrode, and a liquid crystal layer. A voltage may be applied to the pixel electrode and the common electrode to generate an electric field, such that liquid crystal molecules of the liquid crystal layer may be oriented to control transmission of incident light for displaying images. Visibility of the displayed images at different positions (or different viewing angles) with respect to the LCD device may be substantially different. As a result, visibility of the displayed images may be unsatisfactory.

The above information disclosed in this Background section is for enhancement of understanding of the background of this application. The Background section may contain information that does not form the prior art that is already known in this country to a person of ordinary skill in the art.

SUMMARY

An embodiment may be related to a display device. The display device may include a substrate, a transistor, a first pixel electrode, a first-type common electrode, a second-type common electrode, a first-type common voltage line, and a second-type common voltage line. The first pixel electrode may be electrically connected to a drain electrode of the transistor and may include a first-type subpixel electrode and a second-type subpixel electrode. The first-type common electrode may overlap the first-type subpixel electrode in a direction perpendicular to the substrate. The second-type common electrode may overlap the second-type subpixel electrode in the direction perpendicular to the substrate and may extend parallel to the first-type common electrode. The first-type common voltage line may be electrically connected to the first-type common electrode, may be electrically insulated from the second-type common electrode, and may overlap each of the first-type common electrode and the second-type common electrode in the direction perpendicular to the substrate. The second-type common voltage line may be electrically insulated from the first-type common electrode, may be electrically connected to the second-type common electrode, and may overlap each of the first-type common electrode and the second-type common electrode in the direction perpendicular to the substrate.

The first-type common voltage line may extend perpendicular to the first-type common electrode. The second-type common voltage line may extend perpendicular to the second-type common electrode.

The display device may include a data line, which may be electrically connected to a source electrode of the transistor and may extend parallel to the first-type common voltage line. A material of the data line may be identical to a material of the first-type common voltage line.

The display device may include a second pixel electrode, which may immediately neighbor the first pixel electrode. The first-type common voltage line may overlap the first pixel electrode. The second-type common voltage line may overlap the second pixel electrode.

The first pixel electrode may include a stem electrode and a branch electrode. The stem electrode may overlap the first-type common voltage line in the direction perpendicular to the substrate. The branch electrode may be oriented at an acute angle with respect to the stem electrode.

The display device may include a plurality of first-type common electrodes that includes the first-type common electrode. The display device may include a plurality of second-type common electrodes that includes the second-type common electrode. The display device may include a plurality of first-type common voltage lines that includes the first-type common voltage line. All the first-type common voltage lines may be electrically connected to all the first-type common electrodes, may be electrically insulated from all the second-type common electrodes, may overlap each of the first-type common electrodes, and may overlap each of the second-type common electrodes. The display device may include a plurality of second-type common voltage lines that includes the second-type common voltage line. All the second-type common voltage lines may be electrically insulated from all the first-type common electrodes, may be electrically connected to all the second-type common electrodes, may overlap each of the first-type common electrodes, and may overlap each of the second-type common electrodes.

The first-type common voltage lines and the second-type common voltage lines may be alternately arranged.

The first-type common voltage line may include a bent portion that is positioned between the first-type subpixel electrode and the second-type subpixel electrode in a plan view of the display device.

The display device may include a connector that is electrically connected to each of the first-type common voltage line and the first-type common electrode. The display device may include a data line that is electrically connected to a source electrode of the transistor and overlaps the connector in the direction perpendicular to the substrate. A material of the connector may be identical to a material of the first pixel electrode. The connector may be electrically connected to the first-type common voltage line through a contact hole. The contact hole may be positioned between the first-type subpixel electrode and the second-type subpixel electrode in a plan view of the display device. The first pixel electrode may include a stem electrode and a branch electrode. The branch electrode may be oriented at an acute angle with respect to the stem electrode and may be positioned between the first-type common voltage line and the connector in a plan view of the display device.

The display device may include a second pixel electrode, which immediately neighbors the first pixel electrode. The display device may include a first connector that is positioned between the first pixel electrode and the second pixel electrode in a plan view of the display device and is electrically connected to each of the first-type common voltage line and the first-type common electrode. The display device may include a third pixel electrode, which may immediately neighbor the second pixel electrode. The second pixel electrode may be positioned between the first pixel electrode and the third pixel electrode. The display device may include a second connector that is positioned between the second pixel electrode and the third pixel electrode in a plan view of the display device and is electrically connected to each of the second-type common voltage line and the second-type common electrode.

The display device may include a third-type common voltage line. The third-type common voltage line may extend parallel to the first-type common electrode, may be electrically connected to the first-type common electrode, and may be electrically insulated from the second-type common electrode. The display device may include a fourth-type common voltage line. The fourth-type common voltage line may extend parallel to the second-type common electrode, may be electrically insulated from the first-type common electrode, and may be electrically connected to the second-type common electrode.

The display device may include a gate line that is electrically connected to a gate electrode of the transistor. A material of the gate line may be identical to a material of the third-type common voltage line.

The display device may include a connector that is electrically connected to each of the first-type common electrode, the first-type common voltage line, and the third-type common voltage line. The connector may cross the third-type common voltage line in a plan view of the display device. The connector may be electrically connected to the first-type common voltage line and the third-type common voltage line through a same contact hole.

The display device may include an insulating layer. The display device may include a semiconductor layer that directly contacts the first-type common voltage line. The semiconductor layer may be positioned between the first-type common voltage line and the insulating layer. The semiconductor layer may be positioned between the first-type common voltage line and an extension of the third-type common voltage line.

An embodiment may be related to a liquid crystal display device that includes the following elements: a substrate; a plurality of gate lines and a plurality of data lines disposed on the substrate; a plurality of thin film transistors connected to the gate lines and the gate lines; a plurality of pixel electrodes connected to the thin film transistors; a plurality of first (or first-type) horizontal common voltage lines and a plurality of second (or second-type) horizontal common voltage lines disposed on the substrate, extending in a horizontal direction, and configured to respectively transfer a first common voltage and a second common voltage that is different from the first common voltage; a plurality of first (or first-type) vertical common voltage lines and a plurality of second (or second-type) vertical common voltage lines disposed on the substrate, extending in a vertical direction, and configured to respectively transfer the first common voltage and the second common voltage; a plurality of first (or first-type) common electrodes connected to the first horizontal common voltage lines and the first vertical common voltage lines; and a plurality of second (or second-type) common electrodes connected to the second horizontal common voltage lines and the second vertical common voltage lines.

The first common electrodes and the second common electrodes extend in the horizontal direction and are alternately disposed in the vertical direction.

The first horizontal common voltage lines and the second horizontal common voltage lines may be alternately disposed in the vertical direction, and the first vertical common voltage lines and the second vertical common voltage lines may be alternately disposed in the horizontal direction.

Each of the pixel electrodes may include a first (or first-type) subpixel electrode and a second (or second-type) subpixel electrode. The first subpixel electrode may overlap a first common electrode, and the second subpixel electrode may overlap a second common electrode.

The pixel electrodes may include a first pixel electrode, a second pixel electrode, a third pixel electrode, and a fourth pixel electrode which are adjacent in the horizontal direction. Two first vertical common voltage lines may respectively overlap the first and third pixel electrodes, and two second vertical common voltage lines may respectively overlap the second and fourth pixel electrodes.

Each of the subpixel electrodes may include a horizontal stem and a vertical stem. The two first vertical common voltage lines may overlap vertical stems of the first and third pixel electrodes, and the two second vertical common voltage lines may overlap vertical stems of the second and fourth pixel electrodes.

The first common electrode may be connected to the first horizontal common voltage lines and the first vertical common voltage lines through first (or first-type) connectors disposed between the first and second pixel electrodes and between the third and fourth pixel electrodes, and the second common electrode may be connected to the second horizontal common voltage lines and the second vertical common voltage lines through one or more second (or second-type) connectors disposed between the second and third pixel electrodes.

The first and second connectors may overlap one or more data lines.

The first and second connectors may be formed at a same layer as that of the pixel electrodes using a same material.

The liquid crystal display device may further include the following elements: roof layers that face the pixel electrodes; and liquid crystal layers formed in microcavities that are positioned between the pixel electrodes and the roof layers.

The first horizontal common voltage lines, the first vertical common voltage lines, and the first connectors may be connected to each other through first (or first-type) contact holes formed in a first trench between some microcavities that are adjacent in the vertical direction. The second horizontal common voltage lines, the second vertical common voltage lines, and the second connectors may be connected to each other through second (or second-type) contact holes formed in a second trench between other microcavities that are adjacently positioned in the vertical direction.

The first common electrodes may contact the first connectors, and the second common electrodes may contact the second connectors.

The first horizontal common voltage lines may include first (or first-type) extensions that protrude toward the first contact holes, and the second horizontal common voltage lines may include second (or second-type) extensions that protrude toward the second contact holes.

The first connectors may include first (or first-category) extensions that protrude toward the first contact holes, and the second connectors may include second (or second-category) extensions that protrude toward the second contact holes.

The first and second horizontal common voltage lines may be formed at a same layer as that of the gate lines using a same material.

The first and second vertical common voltage lines may be formed at a same layer as that of the data lines using a same material.

Each of the first common voltage and the second common voltage may be changed according to a unit of a frame.

According to embodiments, it is possible to improve visibility of a liquid crystal display device using two common voltages of different levels. Further, since a common voltage is applied to a common electrode from both a horizontal common voltage line and a vertical common voltage line, load of the common electrode and delay of the common voltage can be advantageously reduced.

DETAILED DESCRIPTION OF THE EMBODIMENTS

Figure 1:
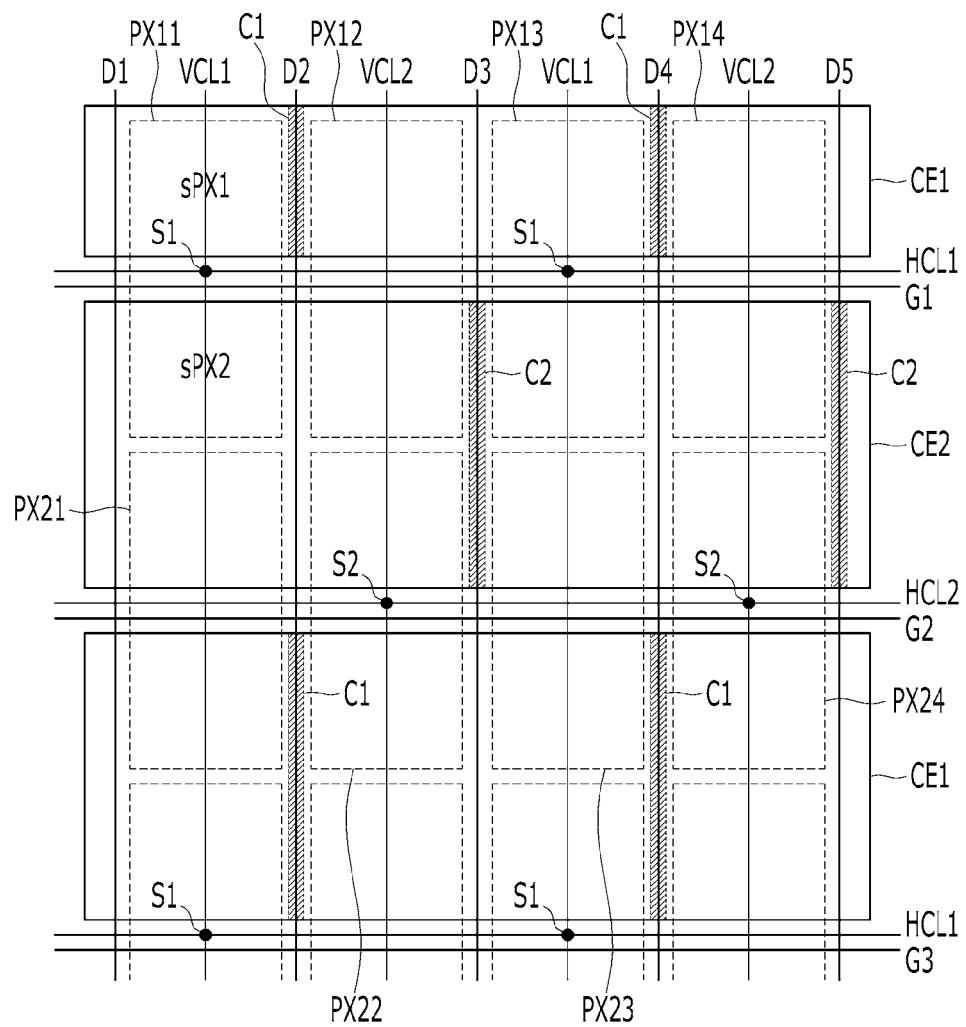
FIG. 1 is a schematic (top) plan view illustrating a liquid crystal display device, or "liquid crystal display" for conciseness, according to an embodiment.

Some embodiments are described with reference to the accompanying drawings. As those skilled in the art would realize, the described embodiments may be modified in various ways.

Although the terms "first", "second", etc. may be used herein to describe various elements, these elements should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used to differentiate different categories or sets of elements. For conciseness, the terms "first", "second", etc. may represent, for example, "first-category (or first-set)", "second-category (or second-set)", etc., respectively.

Like reference numerals may designate like elements in the application. When a first element (such as a layer, film, region, or substrate) is referred to as being "on" a second element, the first element can be directly on the second element, or one or more intervening elements may also be present. In contrast, when a first element is referred to as being "directly on" a second element, there are no intervening elements intentionally provided between the first element and the second element.

The term "connect" may mean "electrically connect". The term "insulate" may mean "electrically insulate". The phrase "formed on" may mean "formed, provided, and/or positioned on".

A drawing and related description may use a particular position and/or orientation of a device as an example. The device may have various positions and/or orientations.

FIG. 1 is a schematic (top) plan view illustrating a liquid crystal display according to an embodiment.

Referring to FIG. 1, the liquid crystal display includes pixels PX11, PX12, PX13, PX14, PX21, etc., which are arranged in a matrix pattern (or array). The liquid crystal display includes signal lines such as gate lines G1, G2, G3, etc. and data lines D1, D2, D3, D4, etc., and pixel electrodes (not illustrated) of the pixels PX11, PX12, etc. are connected to these signal lines through thin film transistors (not illustrated). The liquid crystal display includes horizontal common voltage lines HCL1 and HCL2 (or third-type common voltage lines HCL1 and fourth-type common voltage lines HCL2), vertical common voltage lines VCL1 and VCL2 (or first-type common voltage lines VCL1 and second-type common voltage lines VCL2), and common electrodes CE1 and CE2 connected to these common voltage lines. The pixels PX11, PX12, etc. further include liquid crystal layers (not illustrated) disposed between the pixel electrodes and the common electrodes CE1 and CE2.

The gate lines G1, G2, etc. mainly extend in a row (horizontal) direction and are configured to transfer gate signals (including a gate-on voltage and a gate-off voltage). The data lines D1, D2, etc. mainly extend in a column (vertical) direction and are configured to transfer a data voltage.

In FIG. 1, each dotted-line box corresponds to one pixel. Pixels that are adjacent (and/or aligned) in a row direction may form a pixel row, and pixels that are adjacent (and/or aligned) in a column direction may form a pixel column. Each of the pixels includes a first subpixel sPX1 and a second subpixel sPX2, and a gate line may be disposed between the subpixels sPX1 and sPX2. When the liquid crystal display is in a standing position, the first subpixel sPX1 may be disposed above the corresponding gate line, and the second subpixel sPX2 may be disposed below the corresponding gate line. Though the same data voltage may be applied to the first subpixel sPX1 and the second subpixel sPX2 of one pixel, with different common voltages, one of the subpixels sPX1 and sPX2 may display a relatively high luminance, and the other may display a relatively low luminance.

Horizontal common voltage lines HCL1 and HCL2 mainly extend in a row direction and may be substantially parallel to the gate lines. Each horizontal common voltage line may be disposed between the first subpixel sPX1 and the second subpixel sPX2 of a pixel. In drawing standing position of the liquid crystal display, a horizontal common voltage line may be disposed above or below an associated gate line between the first subpixel sPX1 and the second subpixel sPX2 of a pixel.

The horizontal common voltage lines HCL1 and HCL2 include first horizontal common voltage lines HCL1 for transferring a first common voltage (e.g., Vc1 described with reference to FIG. 7 and/or FIG. 8) and include second horizontal common voltage lines HCL2 for transferring a second common voltage (e.g., Vc2 described with reference to FIG. 7 and/or FIG. 8). The first common voltage and the second common voltage have different levels. The first horizontal common voltage lines HCL1 and the second horizontal common voltage lines HCL2 may be alternately disposed in a column direction. For example, the first horizontal common voltage lines HCL1 and the second horizontal common voltage lines HCL2 may be alternately disposed according to pixel rows. In an embodiment, the first horizontal common voltage lines HCL1 may be disposed at odd-numbered pixel rows and may immediately neighbor the odd-numbered gate lines G1, G3, etc., and the second horizontal common voltage lines HCL2 may be disposed at even-numbered pixel rows and may immediately neighbor the even-numbered gate lines G2, etc. In an embodiment, it is not necessary to dispose the first horizontal common voltage lines HCL1 or the second horizontal common voltage lines HCL2 in all the pixel rows.

The vertical common voltage lines VCL1 and VCL2 include first vertical common voltage lines VCL1 for transferring the first common voltage and include second vertical common voltage lines VCL2 for transferring the second common voltage. The first vertical common voltage lines VCL1 and the second vertical common voltage lines VCL2 may be alternately disposed in a row direction. For example, the first vertical common voltage lines VCL1 and the second vertical common voltage lines VCL2 may be alternately disposed according to pixel columns. In an embodiment, the first vertical common voltage lines VCL1 may be disposed in odd-numbered pixel columns, and the second vertical common voltage lines VCL2 may be disposed in even-numbered pixel columns. In an embodiment, it is unnecessary to dispose the first vertical common voltage lines VCL1 or the second vertical common voltage lines VCL2 in all the pixel columns. The vertical common voltage lines VCL1 and VCL2 may cross a substantially central portion of pixel columns. In an embodiment, the vertical common voltage lines VCL1 and VCL2 may extend adjacent to left or right edges of pixel columns.

The common electrodes CE1 and CE2 include first common electrodes CE1 to which the first common voltage is applied and second common electrodes CE2 to which the second common voltage is applied. The first common electrodes CE1 and the second common electrodes CE2 are alternately disposed in the column direction. For example, in a standing position of the liquid crystal display, a first common electrode CE1 may be disposed above the first gate line G1, a second common electrode CE2 may be disposed between the first gate line G1 and the second gate line G2, a first common electrode CE1 may be disposed between the second gate line G2 and the third gate line G3, and a second common electrode CE2 may be disposed between the third gate line G3 and a fourth gate line (not illustrated).

The first common electrodes CE1 receive the first common voltage from the first horizontal common voltage lines HCL1 and the first vertical common voltage lines VCL1. The first horizontal common voltage lines HCL1 and the first vertical common voltage lines VCL1 may be connected to each other at first contact portions S1, and the first common electrodes CE1 may be connected through first connectors C1 to the first contact portion S1. The first contact portions S1 are disposed only in the pixel columns in which the first vertical common voltage lines VCL1 are disposed, and the first connectors C1 are connected to the first contact portions S1. In an embodiment, in the first pixel row, the first connectors C1 may be disposed between the first subpixel sPX1 of the first pixel PX11 and the first subpixel sPX1 of the second pixel PX12, between the first subpixel sPX1 of the third pixel PX13 and the first subpixel sPX1 of the fourth pixel PX14, etc.

The first common electrode CE1 is typically made of a transparent conductive oxide such as indium tin oxide (ITO) or indium zinc oxide (IZO). Although these materials have resistance that is higher than a metal, the first common voltage Vc1 may be efficiently applied to the first common electrodes CE1 throughout the display panel, since the first common electrodes CE1 are supplied with the first common voltage Vc1 from the first vertical common voltage lines VCL1 as well as the first horizontal common voltage lines HCL1.

The second common electrodes CE2 receive the second common voltage from the second horizontal common voltage lines HCL2 and the second vertical common voltage lines VCL2. The second horizontal common voltage lines HCL2 and the second vertical common voltage lines VCL2 may be connected to each other at second contact portions S2, and the second common electrodes CE2 may be connected through second connectors C2 to the second contact portion S2. The second contact portions S2 are disposed only in the pixel columns in which the second vertical common voltage lines VCL2 are disposed, and the second connectors C2 are connected to the second contact portions S2. In an embodiment, in the first pixel row, second connectors C2 may be disposed between the second subpixel sPX2 of the second pixel PX12 and the second subpixel sPX2 of the third pixel PX13, between the second subpixel sPX2 of the fourth pixel PX14 and the second subpixel sPX2 of the fifth pixel (not illustrated), etc. The second common voltage Vc2 may be efficiently applied to the second common electrodes CE2 through the common voltage lines VCL2 and HCL2.

In an embodiment, the first contact portions S1 and the second contact portions S2 are alternately disposed according to pixel rows and according to pixel columns. The first connector C1 and the second connector C2 may overlap the data lines D1, D2, D3, D4, etc.

A first common electrode CE1 may overlap the first subpixels sPX1 of one pixel row (e.g., the first pixel row), and a second common electrode CE2 may overlap the second subpixels sPX2 of one pixel row (e.g., the last pixel row). Except for the first pixel row and the last pixel row, a first common electrode CE1 may overlap the second subpixels sPX2 and the first subpixels sPX1 of two adjacent pixel rows, and a second common electrode CE2 may overlap the second subpixels sPX2 and the first subpixels sPX1 of two adjacent pixel rows. Accordingly, for example, common voltages Vc1 and Vc2 of different levels may be applied to the first subpixel sPX1 and the second subpixel sPX1 of one pixel (e.g., PX11), and common voltages Vc2 of the same level may be applied to the second subpixel sPX2 and the first subpixel sPX1 of two pixels (e.g., PX11 and PX21) that are adjacent to each other in the column direction.

When the common voltages Vc1 and Vc2 of different levels are applied to the first subpixel sPX1 and the second subpixel sPX2 of one pixel, different voltages are charged to two liquid crystal capacitors formed by the first subpixel sPX1 and the second subpixel sPX2 even though data voltages of the same level are applied to the subpixels sPX1 and sPX2. Charged voltages of the two liquid crystal capacitors may have different gamma curves, and a gamma curve of the pixel may be obtained by combining the different gamma curves. The side visibility of the liquid crystal display can be improved by adjusting a combined gamma curve at the front to coincide with a reference gamma curve at the front and adjusting a combined gamma curve at the side to approximate the reference gamma curve at the front.

Figure 2:
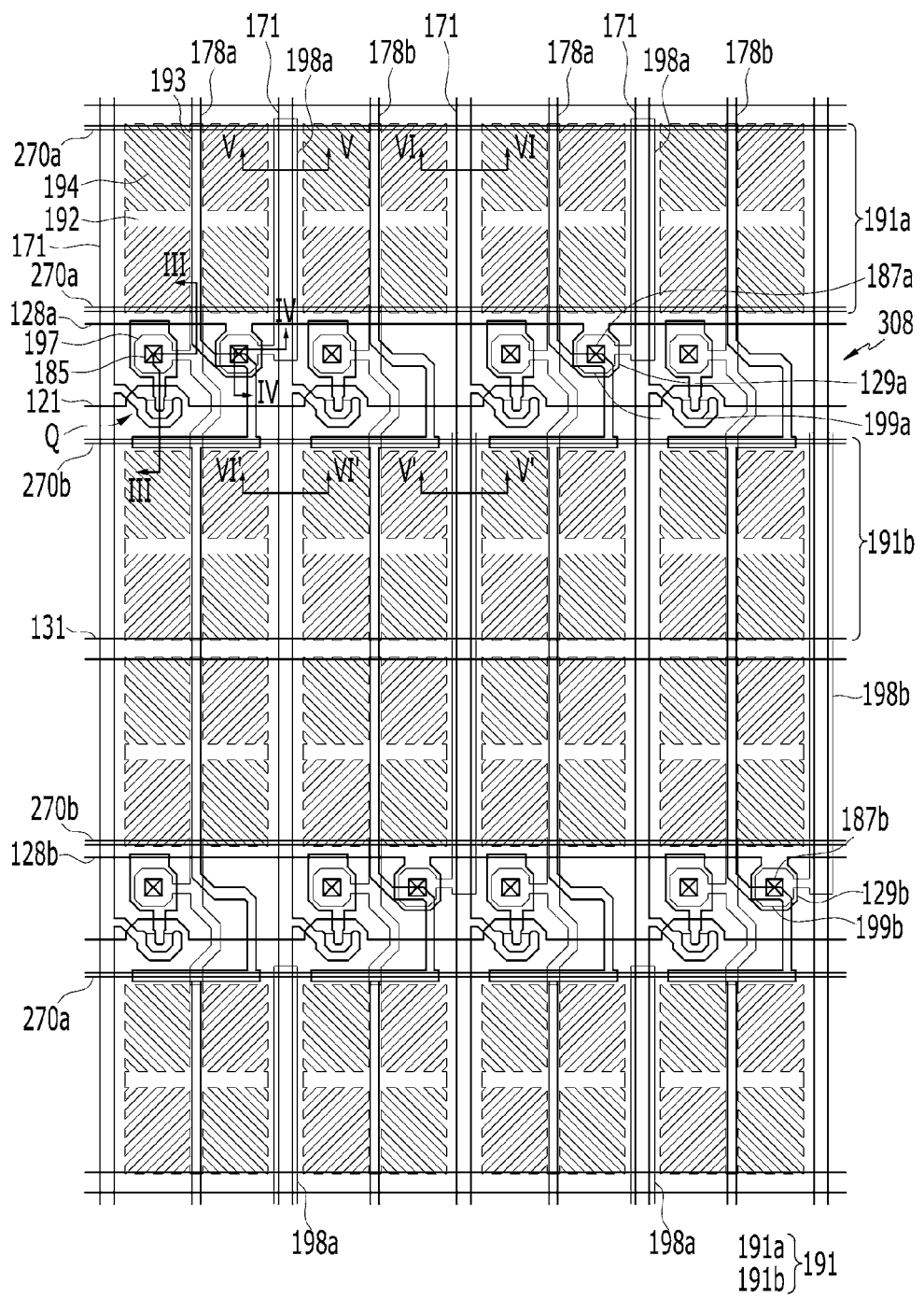
FIG. 2 is a schematic plan view (or layout view) illustrating eight adjacent pixel areas in a liquid crystal display according to an embodiment.
Figure 3:
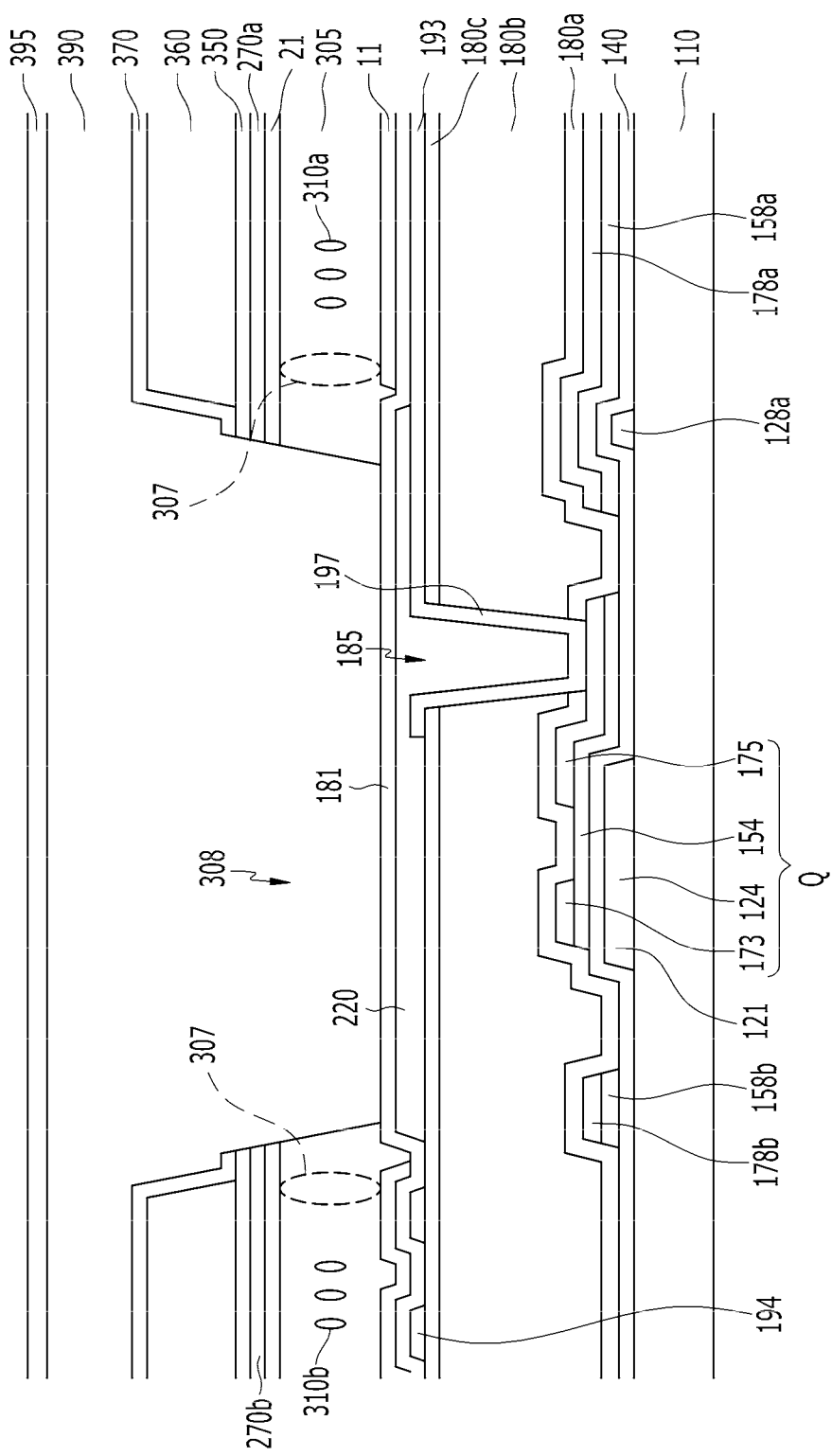
FIG. 3 is a schematic cross-sectional view taken along a line of FIG. 2.
Figure 4:
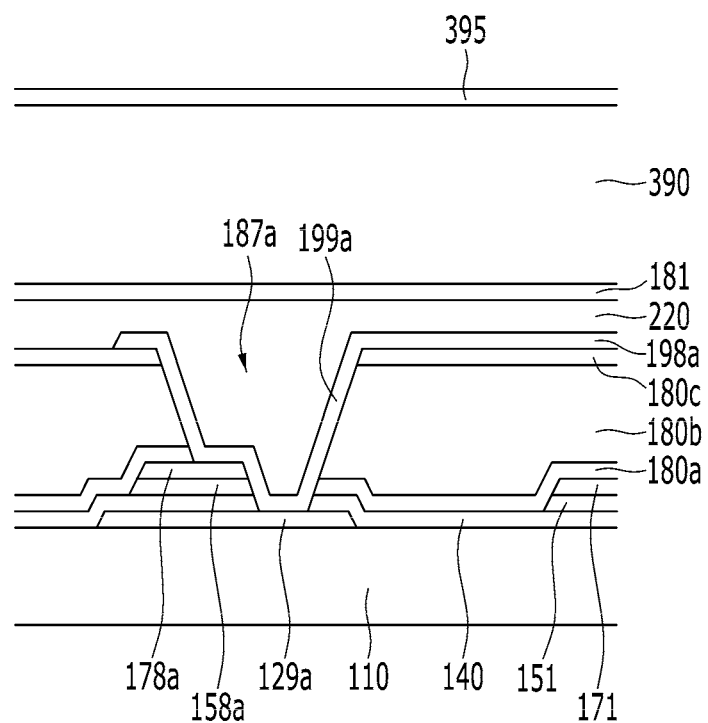
FIG. 4 is a schematic cross-sectional view taken along a line IV-IV of FIG. 2.
Figure 5:
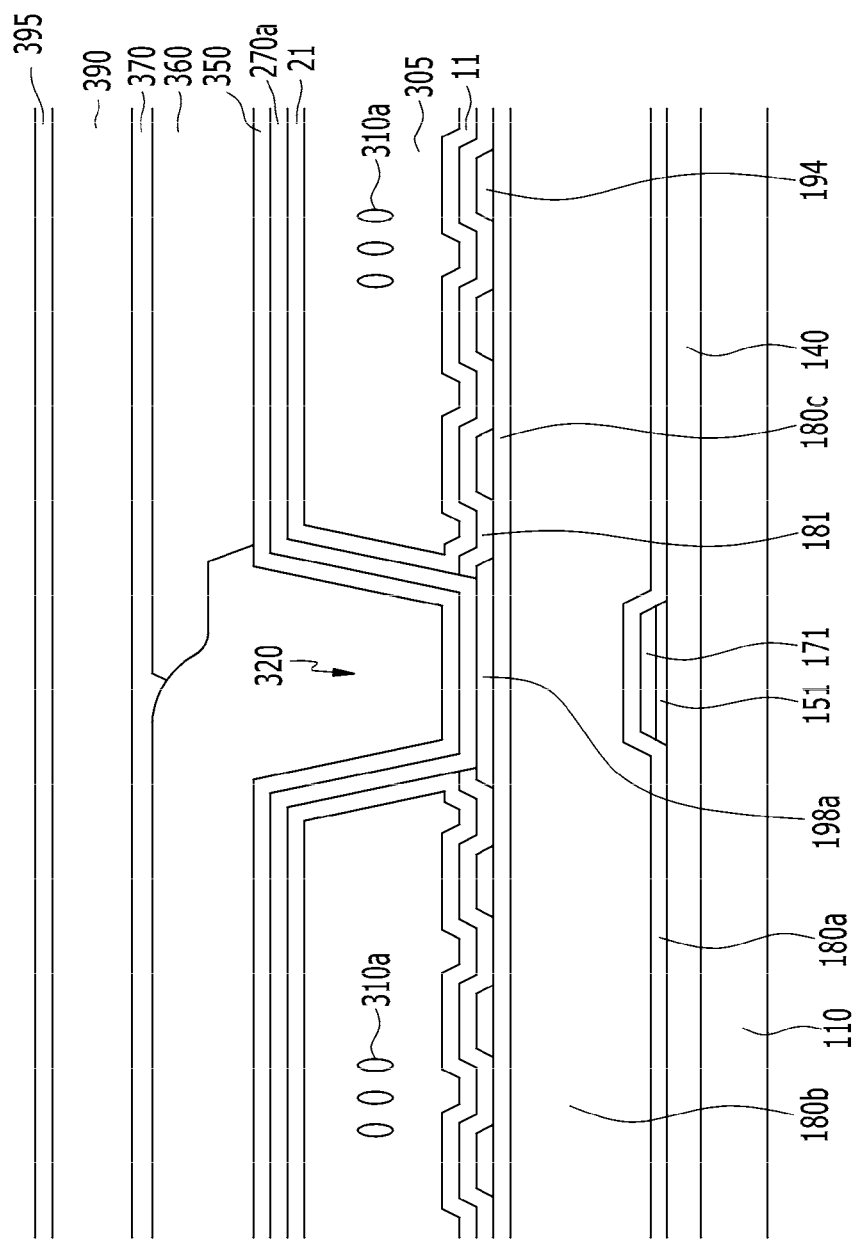
FIG. 5 is a schematic cross-sectional view taken along a line V-V of FIG. 2.
Figure 6:
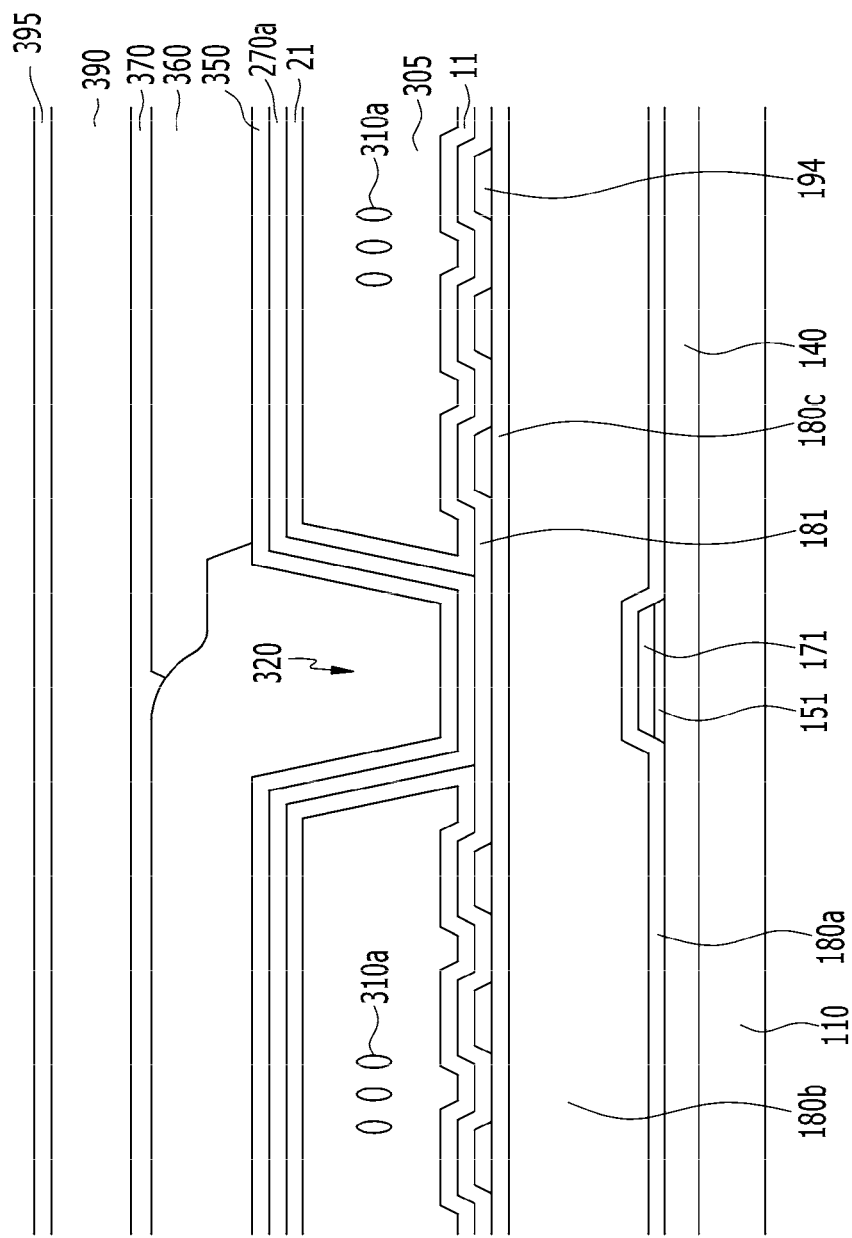
FIG. 6 is a schematic cross-sectional view taken along a line VI-VI of FIG. 2.

FIG. 2 is a schematic plan view (or layout view) illustrating eight adjacent pixel areas in a liquid crystal display according to an embodiment. FIG. 3 is a schematic cross-sectional view taken along a line of FIG. 2, FIG. 4 is a schematic cross-sectional view taken along a line IV-IV of FIG. 2, FIG. 5 is a schematic cross-sectional view taken along a line V-V of FIG. 2, and FIG. 6 is a schematic cross-sectional view taken along a line VI-VI of FIG. 2.

FIG. 2 illustrates structures of pixels among the pixels illustrated in FIG. 1. In the liquid crystal display, pixel areas may be repeatedly arranged.

Referring to FIG. 2 to FIG. 6, a gate line 121 and a storage voltage line 131 are formed on a transparent insulation substrate 110, which may be made of glass or plastic. The gate line 121 includes or is connected to a gate electrode 124. The storage voltage line 131 extends in a substantially horizontal direction. The storage voltage line 131 may have such a structure so as to surround a pixel electrode 191. A first horizontal common voltage line 128a (or third-type common voltage line 128a) and a second horizontal common voltage line 128b (or fourth-type common voltage line 128b) are also formed on the insulation substrate 110. The first horizontal common voltage line 128a includes a first extension 129a protruded therefrom, and the second horizontal common voltage line 128b includes a second extension 129b protruded therefrom. The gate line 121, the storage voltage line 131, and the first and second horizontal common voltage lines 128a and 128b may be made of the same material and may be called gate conductors.

A gate insulating layer 140 is formed on the gate conductors. A semiconductor layer 151 (positioned under a data line 171), a semiconductor layer 154 (positioned below a source/drain electrode), and at a channel portion of a thin film transistor Q are formed on the gate insulating layer 140. An ohmic contact (not illustrated) may be formed among the semiconductor layers 151 and 154, the data line 171, and the source/drain electrodes. Semiconductor layers 158a and 158b respectively positioned below the first and second vertical common voltage lines 178a and 178b may be formed on the gate insulating layer 140.

A source electrode 173, the data line 171 connected to the source electrode 173, and a drain electrode 175 are formed on the semiconductor layers 151 and 154. First and second vertical common voltage lines 178a and 178b (or first-type common voltage line 178a and second-type common voltage line 178b) are respectively formed on the semiconductor layers 158a and 158b. The first and second vertical common voltage lines 178a and 178b generally extend in the column direction, but may be bent between a first subpixel electrode 191a and a second subpixel electrode 191b. The data line 171, the source and drain electrodes 173 and 175, and the first and second vertical common voltage lines 178a and 178b may be made of the same material and may be called data conductors.

The gate electrode 124, the source electrode 173, and the drain electrode 175 form a thin film transistor Q along with the semiconductor layer 154, and a channel of the thin film transistor Q is formed at a portion between the source and drain electrodes 173 and 175 of the semiconductor layer 154.

A first passivation layer 180a is formed on the exposed portion of the semiconductor layer 154 (which is not covered by the data conductors 171, 173, and 175), the source electrode 173, and the drain electrode 175. The first passivation layer 180a may include an inorganic material such as a silicon nitride or a silicon oxide.

A second passivation layer 180b and a third passivation layer 180c may be disposed on the first passivation layer 180a. The second passivation layer 180b may be made of an organic material, and the third passivation layer 180c may include an inorganic material such as a silicon nitride or a silicon oxide. One or two of the first, second, and third passivation layers 180a, 180b, and 180c may be omitted.

A contact hole 185 may be formed by penetrating the first, second, and third passivation layers 180a, 180b, and 180c, and the pixel electrode 191 disposed on the drain electrode 175 and the third passivation layer 180c may be electrically and physically connected via the contact hole 185.

First and second contact holes 187a and 187b are formed in the first passivation layer 180a, the second passivation layer 180b, and the third passivation layer 180c to expose portions of the first and second vertical common voltage lines 178a and 178b. Further, the first and second contact holes 187a and 187b are partially formed to extend through the gate insulating layer 140 so as to expose the first and second extensions 129a and 129b of the first and second horizontal common voltage lines 128a and 128b. The first and second extensions 129a and 129b may be electrically and physically connected to first and second connectors 198a and 198b disposed on the first and second vertical common voltage lines 178a and 178b through the first and second contact holes 187a and 187b.

Specifically, a first extension 199a that protrudes from the first connector 198a toward the first contact hole 187a is formed to contact an exposed portion of the first vertical common voltage line 178a and an exposed portion of the first extension 129a of the first horizontal common voltage line 128a thereon, to electrically connect the first vertical common voltage line 178a and the first horizontal common voltage line 128a by using the first connector 198a. Similarly, a second extension 199b that protrudes from the second connector 198b toward the second contact hole 187b is formed to contact an exposed portion of the second vertical common voltage line 178b and an exposed portion of the second extension 129b of the second horizontal common voltage line 128b thereon, to electrically connect the second vertical common voltage line 178b and the second horizontal common voltage line 128b by using the second connector 198b.

The first contact hole 187a is disposed only in the pixel columns in which the first vertical common voltage line 178a is disposed, and the second contact hole 187b is disposed only in the columns in which the second vertical common voltage line 178b is disposed. The first connector 198a is disposed between microcavities 305 that are adjacent to each other in the row direction, overlaps the data line 171 and a first common electrode 270a, and is physically (or directly) and electrically connected to the first common electrode 270a. The second connector 198b is disposed between microcavities 305 that are adjacent to each other in the row direction, overlap the data line 171 and a second common electrode 270b, and is physically (or directly) and electrically connected to the second common electrode 270b. The first connector 198a and the second connector 198b may be alternately overlap data lines 171. In an embodiment, all the first and second connectors 198a and 198b overlap data lines 171. First connector 198a do not overlap data lines 171 that overlap second connectors 198b, and second connectors 198b do not overlap data line 171 that overlap first connectors 198a. The first and second connectors 198a and 198b and the first and second extensions 199a and 199b may be made of the same material as that of the pixel electrode 191.

Hereinafter, one example of the pixel electrode 191 will be described as an example.

The pixel electrode 191 may be made of a transparent conductive material such as indium tin oxide (ITO) and indium zinc oxide (IZO). The pixel electrode 191 includes the first subpixel electrode 191a and the second subpixel electrode 191b, which are separated from each other. The gate line 121 is positioned between the subpixel electrodes 191a and 191b in the plan view. The first and second subpixel electrodes 191a and 191b have an overall quadrangular shape, and include a cross-shaped stem including a horizontal stem 192 and a vertical stem 193 that crosses the horizontal stem 192. Each of the first and second subpixel electrodes 191a and 191b is divided into four domains by the horizontal stem 192 and the vertical stem 193, and each domain includes a plurality of minute branches 194. When an electric field is applied, directions in which liquid crystal molecules 310a and 310b are inclined can be differently controlled in the four domains, thereby realizing a wide viewing angle. Liquid crystal controllability becomes weak at the cross-shaped stem constituting boundaries of the four domains, and thus transmittance is reduced as compared with other regions of the first and second subpixel electrodes 191a and 191b. Thus, it is possible to minimize the transmittance deterioration caused by the first and second vertical common voltage line 178a and 178b, by forming the first and second vertical common voltage lines 178a and 178b to overlap the vertical stem 193. The first and second subpixel electrodes 191a and 191b may further include an outer stem (not illustrated) for connecting the minute branches 194 thereto at left and right outer circumferences, and this outer stem may be disposed to extend toward upper or lower portions of the first and second subpixel electrodes 191a and 191b.

The minute branches 194 of the first and second subpixel electrode 191a and 191b form an angle of approximately 40° to 45° with the gate line 121 or the horizontal stem 191a. Further, the minute branches of two adjacent domains may be perpendicular to each other. In addition, a width of each minute branch 194 may be gradually increased, or a distance between the minute branches 194 may be varied.

The pixel electrode 191 includes an extension 197 extended from a lower end of the vertical stem 193 of the first subpixel electrode 191a and extended from an upper end of the vertical stem 193 of the second subpixel electrode 191b. The extension 197 has an area that is wider than that of the vertical stem 193. The first and second subpixel electrodes 191a and 191b are electrically and physically connected to the drain electrode 175 through the contact hole 185 at the extension 197, thereby receiving the data voltage from the drain electrode 175.

A light blocking member 220 is disposed on the pixel electrode 191 to cover a region at which the thin film transistor Q is to be formed. The light blocking member 220 may be formed along an extending direction of the gate line 121. The light blocking member 220 may be formed of the material blocking light.

An insulating layer 181 may be formed on the light blocking member 220, and the insulating layer 181 covering the light blocking member 220 may extend on the pixel electrode 191. The insulating layer 181 is made of a silicon nitride or a silicon oxide.

A lower alignment layer 11 is formed on the pixel electrode 191, and may be a vertical alignment layer. The lower alignment layer 11, as a liquid crystal alignment layer made of a material such as polyamic acid, a polysiloxane, a polyimide, or the like, may include at least one of generally used materials. Further, the lower alignment layer 11 may be a photoalignment layer.

An upper alignment layer 21 faces the lower alignment layer 11, and the microcavity 305 is formed between the lower alignment layer 11 and the upper alignment layer 21. A liquid crystal material including liquid crystal molecules 310a and 310b is injected into the microcavity 305, thereby forming a liquid crystal layer. The microcavities 305 may be formed along a column direction of the pixel electrode 191, that is, in the vertical direction. The alignment material forming the alignment layers 11 and 21 and the liquid crystal material including the liquid crystal molecules 310a and 310b may be injected into the microcavity 305 by using capillary force. To that end, each microcavity 305 includes an entrance 307 for injecting these materials. The lower alignment layer 11 and the upper alignment layer 21 may be connected to each other and may be simultaneously formed.

The microcavities 305 are divided by a plurality of trenches 308 positioned at a portion overlapping with the gate line 121 in a vertical direction to form a plurality of microcavities 305, and the plurality of microcavities 305 may be formed in a column direction, that is, a vertical direction of the pixel electrode 191. Further, the microcavity 305 is divided by a partition wall portion 320 to be described below in a horizontal direction to form the plurality of microcavities 305, and the plurality of microcavities 305 may be formed in a row direction of the pixel electrode 191, that is, a horizontal direction in which the gate line 121 extends. Each of the microcavities 305 may correspond to one pixel area or two or more pixel areas.

The first and second common electrodes 270a and 270b and a lower insulating layer 350 are disposed on the upper alignment layer 21. As shown in FIG. 5, in an embodiment, the first connector 198a is disposed between the microcavities 305 that are adjacent to each other in the row direction; the first common electrode 270a is disposed immediately on (that is, directly contacts) the first connector 198a, to be physically (or directly) and electrically connected to the first connector 198a. Similarly, the second common electrode 270b is disposed immediately on the second connector, to be physically (or directly) and electrically connected to the second connector 198b. Accordingly, the first common electrode 270a receives a first common voltage Vc1 through the first connector 198a, and the second common electrode 270b receives a second common voltage Vc2 through the second connector 198b. The first and second common electrodes 270a and 270b generate an electric field together with the first and second subpixel electrodes 191a and 191b to which a data voltage is applied, to determine a degree at which the liquid crystal molecules 310a and 310b positioned in the microcavities 305 between these common electrodes 270a and 270b are inclined. Accordingly, the pixel electrode and the common electrodes are referred to as field generating electrodes.

Since different common voltages Vc1 and Vc2 are applied to the first common electrode 270a the second common electrode 270b, a magnitude of the electric field generated by the first subpixel electrode 191a and the first common electrode 270a is different from that of the electric field generated by the second subpixel electrode 191b and the second common electrode 270b. Accordingly, although the same data voltage is applied to the first subpixel electrode 191a and the second subpixel electrode 191b through one thin film transistor Q, the degree at which the liquid crystal molecules 310a positioned between the first subpixel electrode 191a and the first common electrode 270a and the degree at which the liquid crystal molecules 310b positioned between the second subpixel electrode 191b and the second common electrode 270b are controlled to be different from each other. The first and second common electrodes 270a and 279b constitute capacitors together with the first and second subpixel electrodes 191a and 191b to maintain the applied voltage even after the thin film transistor is turned off. The lower insulating layer 350 may be made of a silicon nitride or a silicon oxide.

A cross-section taken from a line V'-V' in FIG. 2 is analogous to FIG. 5, and a cross-section taken from a line VI'-VI' in FIG. 2 is analogous to FIG. 6. However, in the cross-section taken from the line V'-V', the second connector 198b and the second common electrode 270b are disposed instead of the first connector 198a and the first common electrode 270a of FIG. 5.

An embodiment in which the first and second common electrodes 270a and 270b are formed above the microcavity 305 is illustrated. However, according to an embodiment, the first and second common electrodes 270a and 270b may be formed below the microcavity 305 to facilitate liquid crystal driving according to the coplanar electrode (CE) mode.

A roof layer 360 is positioned on the lower insulating layer 350. The roof layer 360 serves to support the microcavity 305 which is a space between the pixel electrode 191 and the common electrodes 270a and 270b to be formed.

The roof layer 360 may include a photoresist or other organic materials. The roof layer 360 may also be formed by a color filter. In this case, as illustrated in FIG. 9, color filters having different colors overlap with each other to form a partition 320. The partition 320 is positioned between the microcavities 305 adjacent to each other in a horizontal direction. The partition 320 may be formed in an extending direction of the data line 171 and may partition or define the microcavity 305. The partition 320 may be formed in an extending direction of the data line 171 and may partition or define the microcavity 305. The roof layer 360 may also include an inorganic material.

An upper insulating layer 370 is positioned on the roof layer 360. The upper insulating layer 370 may be made of a silicon nitride or a silicon oxide.

A capping layer 390 is disposed on the upper insulating layer 370. The capping layer 390 is positioned even in the trench 308 and covers the entrance 307 of the microcavity 305 exposed by the trench 308. The capping layer 390 includes an organic material or an inorganic material. In the drawing, it is illustrated that the liquid crystal material is removed from the trench 308, but the remaining liquid crystal material after being injected into the microcavity 305 may also exist in the trench 308. In this case, since the capping layer 390 contacts the liquid crystal material to contaminate the liquid crystal material, the capping layer 390 may be made of a material such as parylene which does not react with the liquid crystal material.

A barrier layer 395 for preventing external moisture or oxygen from being permeated may be formed on the capping layer 390. The barrier layer 395 may be made of an inorganic material or an organic material.

In summary, referring to FIG. 1, FIG. 2, FIG. 3, FIG. 4, FIG. 5, and FIG. 6, the display device may include a substrate 110, a transistor Q, a first pixel electrode 191, a first-type common electrode 270a, a second-type common electrode 270b, a first-type common voltage line 178a, and a second-type common voltage line 178b. The first pixel electrode 191 may be electrically connected to a drain electrode 175 of the transistor Q and may include a first-type subpixel electrode 191a and a second-type subpixel electrode 191b. The first-type common electrode 270a may overlap the first-type subpixel electrode 191a in a direction perpendicular to the substrate 110. The second-type common electrode 270b may overlap the second-type subpixel electrode 191b in the direction perpendicular to the substrate 110 and may extend parallel to the first-type common electrode 270a. The first-type common voltage line 178a may be electrically connected to the first-type common electrode 270a, may be electrically insulated from the second-type common electrode 270b, and may overlap each of the first-type common electrode 270a and the second-type common electrode 270b in the direction perpendicular to the substrate 110. The second-type common voltage line 178b may be electrically insulated from the first-type common electrode 270a, may be electrically connected to the second-type common electrode 270b, and may overlap each of the first-type common electrode 270a and the second-type common electrode 270b in the direction perpendicular to the substrate 110.

The first-type common voltage line 178a may extend perpendicular to the first-type common electrode 270a. The second-type common voltage line 178b may extend perpendicular to the second-type common electrode 270b.

The display device may include a data line 171, which may be electrically connected to a source electrode 173 of the transistor Q and may extend parallel to the first-type common voltage line 178a. A material of the data line 171 may be identical to a material of the first-type common voltage line 178a.

The display device may include a second pixel electrode 191, which may immediately neighbor the first pixel electrode 191. The first-type common voltage line 178a may overlap the first pixel electrode 191. The second-type common voltage line 178b may overlap the second pixel electrode 191.

The first pixel electrode 191 may include a stem electrode 193 and a branch electrode 194. The stem electrode 193 may overlap the first-type common voltage line 178a in the direction perpendicular to the substrate 110. The branch electrode 194 may be oriented at an acute angle with respect to the stem electrode 193.

The display device may include a plurality of first-type common electrodes 270a that includes the first-type common electrode 270a. The display device may include a plurality of second-type common electrodes 270b that includes the second-type common electrode 270b. The display device may include a plurality of first-type common voltage lines 178a that includes the first-type common voltage line 178a. All the first-type common voltage lines 178a may be electrically connected to all the first-type common electrodes 270a, may be electrically insulated from all the second-type common electrodes 270b, may overlap each of the first-type common electrodes 270a, and may overlap each of the second-type common electrodes 270b. The display device may include a plurality of second-type common voltage lines 178b that includes the second-type common voltage line 178b. All the second-type common voltage lines 178b may be electrically insulated from all the first-type common electrodes 270a, may be electrically connected to all the second-type common electrodes 270b, may overlap each of the first-type common electrodes 270a, and may overlap each of the second-type common electrodes 270b.

The first-type common voltage lines 178a and the second-type common voltage lines 178b may be alternately arranged.

The first-type common voltage line 178a may include a bent portion that is positioned between the first-type subpixel electrode 191a and the second-type subpixel electrode 191b in a plan view of the display device.

The display device may include a connector 198a that is electrically connected to each of the first-type common voltage line 178a and the first-type common electrode 270a. The display device may include a data line 171 that is electrically connected to a source electrode 173 of the transistor Q and overlaps the connector 198a in the direction perpendicular to the substrate 110. A material of the connector 198a may be identical to a material of the first pixel electrode 191. The connector 198a may be electrically connected to the first-type common voltage line 178a through a contact hole 187a. The contact hole 187a may be positioned between the first-type subpixel electrode 191a and the second-type subpixel electrode 191b in a plan view of the display device. The first pixel electrode 191 may include a stem electrode 193 and a branch electrode 194. The branch electrode 194 may be oriented at an acute angle with respect to the stem electrode 193 and may be positioned between the first-type common voltage line 178a and the connector 198a in a plan view of the display device.

The display device may include a second pixel electrode 191, which immediately neighbors the first pixel electrode 191. The display device may include a first connector 198a that is positioned between the first pixel electrode 191 and the second pixel electrode 191 in a plan view of the display device and is electrically connected to each of the first-type common voltage line 178a and the first-type common electrode 270a. The display device may include a third pixel electrode 191, which may immediately neighbor the second pixel electrode 191. The second pixel electrode 191 may be positioned between the first pixel electrode 191 and the third pixel electrode 191. The display device may include a second connector 198b that is positioned between the second pixel electrode 191 and the third pixel electrode 191 in a plan view of the display device and is electrically connected to each of the second-type common voltage line 178b and the second-type common electrode 270b.

The display device may include a third-type common voltage line 128a. The third-type common voltage line 128a may extend parallel to the first-type common electrode 270a, may be electrically connected to the first-type common electrode 270a, and may be electrically insulated from the second-type common electrode 270b. The display device may include a fourth-type common voltage line 128b. The fourth-type common voltage line 128b may extend parallel to the second-type common electrode 270b, may be electrically insulated from the first-type common electrode 270a, and may be electrically connected to the second-type common electrode 270b.

The display device may include a gate line 121 that is electrically connected to a gate electrode 124 of the transistor Q. A material of the gate line 121 may be identical to a material of the third-type common voltage line 128a.

The display device may include a connector 198a that is electrically connected to each of the first-type common electrode 270a, the first-type common voltage line 178a, and the third-type common voltage line 128a. The connector 198a may cross the third-type common voltage line 128a in a plan view of the display device. The connector 198a may be electrically connected to the first-type common voltage line 178a and the third-type common voltage line 128a through a same contact hole 187a.

The display device may include an insulating layer 140. The display device may include a semiconductor layer 158a that directly contacts the first-type common voltage line 178a. The semiconductor layer 158a may be positioned between the first-type common voltage line 178a and the insulating layer 140. The semiconductor layer 158a may be positioned between the first-type common voltage line 178a and an extension 129a of the third-type common voltage line 128a.

Figure 7:
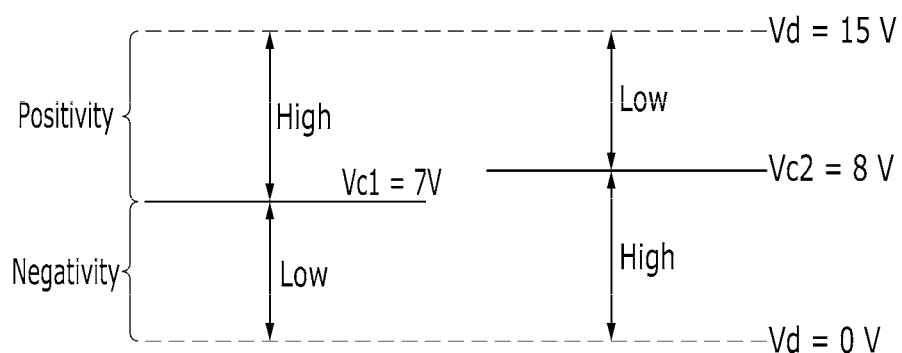
FIG. 7 illustrates data voltages and common voltages that are applied to a liquid crystal display according to an embodiment.
Figure 8:
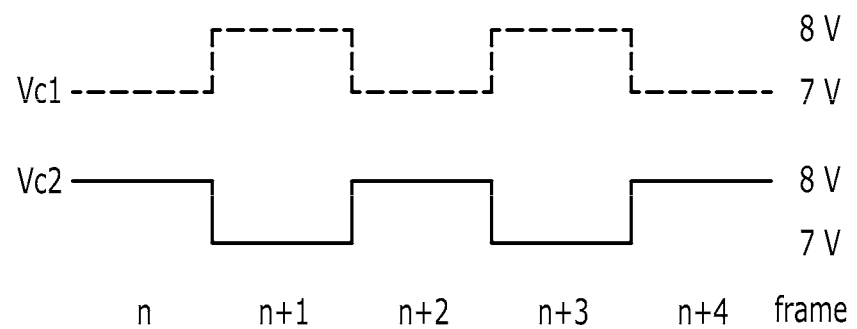
FIG. 8 illustrates common voltages that are applied to a liquid crystal display according to an embodiment.

FIG. 7 and FIG. 8 illustrate data voltages Vd, a first common voltage Vc1, and a second common voltage Vc2 that are applied to a liquid crystal display according to an embodiment.

Referring to FIG. 7, a data voltage Vd may be in a range of 0 V to 15 V, for example. The data voltages Vd may include a positive data voltage Vd and a negative data voltage. The positive data voltage Vd indicates a voltage that is higher than the common voltage, and the negative voltage indicates a voltage that is lower than the common voltage. That is, positivity and negativity of the data voltage are relative concepts based on the common voltage. A data voltage Vd may be equally applied to the first subpixel electrode 191a and the second subpixel electrode 191b.

Referring to FIG. 7 and FIG. 8, the common voltages include a first common voltage Vc1 and a second common voltage Vc2. For example, the first common voltage Vc1 may swing between 7 V and 8 V, and the second common voltage Vc2 may swing between 7 V and 8 V. In an embodiment, a swing cycle may be one frame. The first common voltage Vc1 and the second common voltage Vc2 have opposite phases. For example, while the first common voltage Vc1 is 7 V, the second common voltage Vc2 is 8 V, and while the first common voltage Vc1 is 8 V, the second common voltage Vc2 is 7 V. As a result, for example, in a $n^{th}$ frame, when 7 V is applied to the first common electrode 270a, 8 V is applied to the second common electrode 270b; even though the same data voltage (e.g., 15 V) is applied to the first subpixel electrode 191a and the second subpixel electrode 191b, a voltage difference of 8 V in the first subpixel sPX1 is greater than a voltage difference of 7 V in the second subpixel sPX2. Thus, the first subpixel sPX1 can provide transmittance that is higher than that of the second subpixel sPX2. In an $(n+1)^{th}$ frame, 8 V is applied to the first common electrode 270a, and 7 V is applied to the second common electrode 270b, and a voltage difference of 7 V in the first subpixel sPX1 is smaller than a voltage difference of 8 V in the second subpixel sPX2. Thus, the second subpixel sPX2 can provide transmittance that is higher than that of the first subpixel sPX1. As such, the first subpixel sPX1 and the second subpixel sPX2 can alternately provide a relatively high transmittance for alternate frames, and the side visibility of the display device and/or images displayed by the display device can be optimized using the transmittance difference of the two subpixels sPX1 and sPX2.

While some embodiments have been described as examples, possible embodiments are not limited to the described embodiments. Embodiments are intended to cover various modifications and equivalent arrangements applicable within the spirit and scope defined by the appended claims.

What is claimed is:

1. A display device comprising:
   a transistor;
   a first pixel electrode electrically connected to a drain electrode of the transistor and comprising a first-type subpixel electrode and a second-type subpixel electrode;
   a first-type common electrode overlapping the first-type subpixel electrode;
   a second-type common electrode overlapping the second-type subpixel electrode;
   a first-type common voltage line electrically connected to the first-type common electrode, electrically insulated from the second-type common electrode, and overlapping each of the first-type common electrode and the second-type common electrode; and a second-type common voltage line electrically insulated from the first-type common electrode, electrically connected to the second-type common electrode, and overlapping each of the first-type common electrode and the second-type common electrode.

2. The display device of claim 1, wherein the first-type common voltage line extends perpendicular to the first-type common electrode.

3. The display device of claim 2, wherein the second-type common voltage line extends perpendicular to the second-type common electrode.

4. The display device of claim 1 comprising: a data line electrically connected to a source electrode of the transistor and extending parallel to the first-type common voltage line.

5. The display device of claim 4, wherein a material of the data line is identical to a material of the first-type common voltage line.

6. The display device of claim 1 comprising: a second pixel electrode, which immediately neighbors the first pixel electrode, wherein the first-type common voltage line overlaps the first pixel electrode, and wherein the second-type common voltage line overlaps the second pixel electrode.

7. The display device of claim 1, wherein the first pixel electrode comprises a stem electrode and a branch electrode, wherein the stem electrode overlaps the first-type common voltage line, and wherein the branch electrode is oriented at an acute angle with respect to the stem electrode.

8. The display device of claim 1 comprising:
a plurality of first-type common electrodes that comprises the first-type common electrode;
a plurality of second-type common electrodes that comprises the second-type common electrode;
a plurality of first-type common voltage lines that comprises the first-type common voltage line, wherein the first-type common voltage lines are electrically connected to the first-type common electrodes, are electrically insulated from the second-type common electrodes, overlap each of the first-type common electrodes, and overlap each of the second-type common electrodes; and
a plurality of second-type common voltage lines that comprises the second-type common voltage line, wherein the second-type common voltage lines are electrically insulated from the first-type common electrodes, are electrically connected to the second-type common electrodes, overlap each of the first-type common electrodes, and overlap each of the second-type common electrodes.

9. The display device of claim 8, wherein the first-type common voltage lines and the second-type common voltage lines are alternately arranged.

10. The display device of claim 1, wherein the first-type common voltage line comprises a bent portion positioned between the first-type subpixel electrode and the second-type subpixel electrode in a plan view of the display device.

11. The display device of claim 1 comprising:
a connector electrically connected to each of the first-type common voltage line and the first-type common electrode; and
a data line electrically connected to a source electrode of the transistor and overlapping the connector.

12. The display device of claim 1 comprising: a connector electrically connected to the first-type common electrode, wherein a material of the connector is identical to a material of the first pixel electrode.

13. The display device of claim 1 comprising: a connector electrically connected to the first-type common electrode, wherein the connector is electrically connected to the first-type common voltage line through a contact hole, and wherein the contact hole is positioned between the first-type subpixel electrode and the second-type subpixel electrode in a plan view of the display device.

14. The display device of claim 1 comprising: a connector electrically connected to each of the first-type common voltage line and the first-type common electrode, wherein the first pixel electrode comprises a stem electrode and a branch electrode, wherein the branch electrode is oriented at an acute angle with respect to the stem electrode and is positioned between the first-type common voltage line and the connector in a plan view of the display device.

15. The display device of claim 1 comprising:
a second pixel electrode, which immediately neighbors the first pixel electrode; and
a first connector positioned between the first pixel electrode and the second pixel electrode in a plan view of the display device and electrically connected to each of the first-type common voltage line and the first-type common electrode.

16. The display device of claim 15 comprising:
a third pixel electrode, which immediately neighbors the second pixel electrode, wherein the second pixel electrode is positioned between the first pixel electrode and the third pixel electrode; and
a second connector positioned between the second pixel electrode and the third pixel electrode in a plan view of the display device and electrically connected to each of the second-type common voltage line and the second-type common electrode.

17. The display device of claim 1 comprising:
a third-type common voltage line extending parallel to the first-type common electrode, electrically connected to the first-type common electrode, and electrically insulated from the second-type common electrode; and
a fourth-type common voltage line extending parallel to the second-type common electrode, electrically insulated from the first-type common electrode, and electrically connected to the second-type common electrode.

18. The display device of claim 17 comprising: a gate line electrically connected to a gate electrode of the transistor, wherein a material of the gate line is identical to a material of the third-type common voltage line.

19. The display device of claim 17 comprising: a connector electrically connected to each of the first-type common electrode, the first-type common voltage line, and the third-type common voltage line, wherein the connector crosses the third-type common voltage line in a plan view of the display device.

20. The display device of claim 17 comprising: a connector electrically connected to the first-type common electrode, wherein the connector is electrically connected to the first-type common voltage line and the third-type common voltage line through a same contact hole.

* * * * *